US007904860B1

(12) United States Patent
Rahut

(10) Patent No.: US 7,904,860 B1
(45) Date of Patent: *Mar. 8, 2011

(54) METHOD AND APPARATUS FOR SELECTING PROGRAMMABLE INTERCONNECTS TO REDUCE CLOCK SKEW

(75) Inventor: Anirban Rahut, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 277 days.

This patent is subject to a terminal disclaimer.

(21) Appl. No.: 12/194,403

(22) Filed: Aug. 19, 2008

Related U.S. Application Data

(60) Division of application No. 11/200,686, filed on Aug. 10, 2005, now Pat. No. 7,430,728, which is a continuation of application No. 10/631,564, filed on Jul. 30, 2003, now Pat. No. 6,952,813.

(51) Int. Cl.
*G06F 17/50* (2006.01)
(52) U.S. Cl. .................. 716/105; 716/110; 716/116
(58) Field of Classification Search .................. 716/105, 716/110, 116
See application file for complete search history.

(56) References Cited

U.S. PATENT DOCUMENTS

| 5,077,676 | A |   | 12/1991 | Johnson et al. |
|-----------|---|---|---------|----------------|
| 5,298,866 | A |   | 3/1994  | Kaplinsky |
| 5,369,640 | A |   | 11/1994 | Watson et al. |
| 5,384,497 | A | * | 1/1995  | Britton et al. ............ 326/44 |
| 5,391,942 | A | * | 2/1995  | El-Ayat et al. ............ 326/39 |
| 5,452,239 | A |   | 9/1995  | Dai et al. |
| 5,475,830 | A |   | 12/1995 | Chen et al. |
| 5,526,278 | A |   | 6/1996  | Powell |
| 5,648,913 | A | * | 7/1997  | Bennett et al. ............ 716/6 |
| 5,717,229 | A |   | 2/1998  | Zhu |
| 5,790,479 | A |   | 8/1998  | Conn |
| 5,943,490 | A |   | 8/1999  | Sample |
| 6,006,025 | A |   | 12/1999 | Cook et al. |
| 6,177,844 | B1 |  | 1/2001  | Sung et al. |
| 6,204,690 | B1 |  | 3/2001  | Young et al. |
| 6,292,020 | B1 |  | 9/2001  | Crabill |
| 6,327,696 | B1 |  | 12/2001 | Mahajan |
| 6,373,288 | B1 | * | 4/2002 | Ganzelmi et al. ............ 326/93 |
| 6,396,303 | B1 |  | 5/2002  | Young |
| 6,446,249 | B1 | * | 9/2002 | Wang et al. ............ 716/17 |
| 6,609,241 | B2 | * | 8/2003 | Yonemori ............ 716/12 |
| 6,651,232 | B1 |  | 11/2003 | Pileggi et al. |
| 6,661,254 | B1 |  | 12/2003 | Agrawal et al. |
| 6,862,548 | B1 |  | 3/2005  | Chan |
| 6,952,813 | B1 |  | 10/2005 | Rahut |

OTHER PUBLICATIONS

U.S. Appl. No. 11/200,686, filed Aug. 10, 2005, Rahut.

(Continued)

*Primary Examiner* — Naum B Levin
(74) *Attorney, Agent, or Firm* — W. Eric Webostad; John J. King

(57) ABSTRACT

A method and apparatus for selecting programmable interconnects to reduce clock skew is described. A routing tree for clock signals is created having routes and clock pin nodes. Delays of the clock signals to the clock pin nodes are determined. The routing tree is balanced to a target clock skew, such as zero clock skew, for the clock signals provided to the clock pin nodes. Programmable interconnect circuits are selectively added to reduce clock skews of the clock signals, where the clock skews being reduced at the clock pin nodes are for at least a portion of the clock pin nodes. Additionally described are determining clock propagation delays to clock pins and balancing a clock tree using computer aided design.

20 Claims, 9 Drawing Sheets

OTHER PUBLICATIONS

Rubinstein, Jorge et al., "Signal Delay in RC Tree Networks," *IEEE Transactions on Computer-Aided Design*, Jul. 1983, pp. 202-211, vol. CAD-2, No. 3.

Elmore, W. C., "The Transient Response of Damped Linear Networks with Particular Regard to Wideband Amplifiers," *J. Appl. Phys.*, Jan. 1948, pp. 55-63, vol. 19, Issue 1.

* cited by examiner

METHOD AND APPARATUS FOR SELECTING PROGRAMMABLE INTERCONNECTS TO REDUCE CLOCK SKEW

FIELD OF THE INVENTION

One or more aspects of the present invention relate generally to reducing clock skew and more particularly, to reducing clock skew by selectively adding one or more programmable interconnects.

BACKGROUND OF THE INVENTION

Clock signals within an integrated circuit may not arrive at all registers at the same time. Part of this variation in time in which a clock signal arrives at different times is due to differences in propagation delay, namely, respective delays from a clock source to different placed and routed loads. This is conventionally referred to as clock skew meaning a difference in arrival time of a clock signal to various clock pins. Notably, clock skew sometimes means the maximum difference in arrival time of a clock signal to multiple similarly clocked circuits, such as registers or flip-flops. Clock skew is a barrier to performance enhancement. A well-known formula for determining clock period for a clock signal passing through intermediate logic to a clocked flip-flop is the sum of time delays associated with any intermediate logic, clock skew, jitter, setup time of the flip-flop and clock-to-output time (delay of the clocked circuit; "clk-q") of the preceding flip-flop.

One approach to limiting clock skew, namely, reducing the variability in clock signal edge arrival times, in programmable logic devices is to use dedicated clock routing resources. Dedicated clock routing resources conventionally include integrated-circuit ("GLOBAL") routing resources. These GLOBAL routing resources contain balanced buffered resources ("GLOBAL wires") formed in a tree pattern to registers of an integrated circuit, such that a clock edge arrives at the same time at all such registers, such as flip-flops, when routed using these GLOBAL routing resources. Clock signals from source to load only using only dedicated clock resources are conventionally referred to as "global clock signals."

Dedicated clock routing resources conventionally have equivalent buffering with respect to resistance-capacitance ("RC") delay. Furthermore, clock trees, such as an H-tree, are conventionally balanced, such that delay from a clock source to a similarly positioned load pin of a clock tree is approximately the same. A delay calculator may be used to determine an RC delay calculation for a tree from a clock source to each load pin, for example using RC tree based Penfield-Rubinstein, Elmore or other known delay calculation.

Notably, for programmable logic devices, a general routing fabric, other than dedicated clock resources, may be used for propagating clock signals in order to instantiate a circuit design. This use of general routing fabric may be due to a limited availability of GLOBAL resources. Clock signals distributed using such general routing resources are conventionally referred to as "local clock signals."

The general routing fabric may be used to propagate clock signals, because it is programmable and allows for the formation of one or more communication paths between two circuit blocks, for example, two configurable logic blocks of the programmable logic device. Interconnections between blocks are composed of a two-layer grid of metal segments. Specially designed pass transistors, each controlled by a configuration bit, form programmable interconnect points (PIPs) and switching matrices in order to implement the necessary connections to form the communication path(s).

Such general routing fabric may include wires that extend at least approximately the longitudinal dimension ("HLONG wire" or "HLONG") and lateral dimension ("VLONG wire" or "VLONG") of the programmable logic device, and may include longitudinal and lateral wires that do not extend approximately the longitudinal and lateral dimensions of the programmable logic device. For example, there are half length HLONG and VLONG wires, namely, "HHLONG wires" and "VHLONG wires", or "HHLONGs" and "VHLONGs", respectively, that extend approximately half the distance of the longitudinal and lateral distances of the programmable logic.

In order to reduce clock skew for "local clock signals", a template or a pattern based approach is used by CAD tools. For example, for every load pin of a local clock signal uses the same pattern of wires, such as HLONG, followed by HHLONG, followed by VLONG, followed by VHLONG, followed by a clock pin. Because the same pattern is used for all the load pins of a clock signal, the delay of such a clock signal to all such load pins is conventionally substantially consistent. However, such general routing fabric conventionally has greater variability with respect to RC values than dedicated clock resources. This RC value variability can lead to an increase in clock skew even with the use of pattern or template routing. Notably, conventionally general routing resources are not made in the highest level(s) of integrated circuit metal layer(s) and are not balanced, such as in a tree pattern, like global resources. As a result, resistance of wires leads to higher and higher delay as a clock signal travels farther away from a clock source. So, for example, two sets of clock load pins which are sourced from an HLONG wire with different distances from the same sourcing PIP, conventionally will have different delays due to use of such an HLONG wire.

Accordingly, it would be both desirable and useful to provide means for reducing clock skew for designs instantiated in a programmable logic device.

SUMMARY OF THE INVENTION

An aspect of the invention is a method for reducing clock skew. A placed and routed design is obtained from which a routing tree is generated. The routing tree has at least one route and clock pin nodes. The clock signal is divided into clock signals responsive to the clock pin nodes. Delays of the clock signals to the clock pin nodes are determined. The routing tree is balanced to a target clock skew, and programmable interconnect circuits are selectively added to the routing tree to reduce clock skews of the clock signals, where the clock skews being reduced at the clock pin nodes are for at least a portion of the clock pin nodes.

Another aspect of the invention is a method for determining clock propagation delay to clock pins. A routing tree for a clock signal is generated from which are obtained a first node and a second node for a route. The first node has a first delay value, and the second node has a second delay value. The second node is one level closer to a source clock node than the first node. If the second node is determined to be a fork node, the second delay value is set equal to the maximum of the first delay value and the second delay value.

Another aspect of the invention is a method for balancing a clock tree using computer aided design. A route for the clock tree and a node on the route are obtained. Unused programmable interconnect points electrically downstream from the node are identified. A resistive-capacitive network is generated in association with the node from the route. A programmable interconnect point of the used programmable interconnect points is added to the resistive-capacitive network; and added delay due to the added programmable interconnect point is determined.

BRIEF DESCRIPTION OF THE DRAWINGS

Accompanying drawing(s) show exemplary embodiment(s) in accordance with one or more aspects of the present invention; however, the accompanying drawing(s) should not be taken to limit the present invention to the embodiment(s) shown, but are for explanation and understanding only.

DETAILED DESCRIPTION

In order to reduce clock skew, local clocks are routed using templates. By using templates, the same pattern may be used for routing all of the pins of the same local clock. This facilitates a more balance approach to routing of local clocks, as a same pattern may be used for routing all the pins of a local clock signal. However, a perfectly balanced H-tree clock network is not always possible in programmable logic devices, at least in part due distribution of PIPs. Distribution of PIPs or "pipulation" is a significant factor among other device specific issues contributing to clock skew, in addition to RC values.

Figure 1:
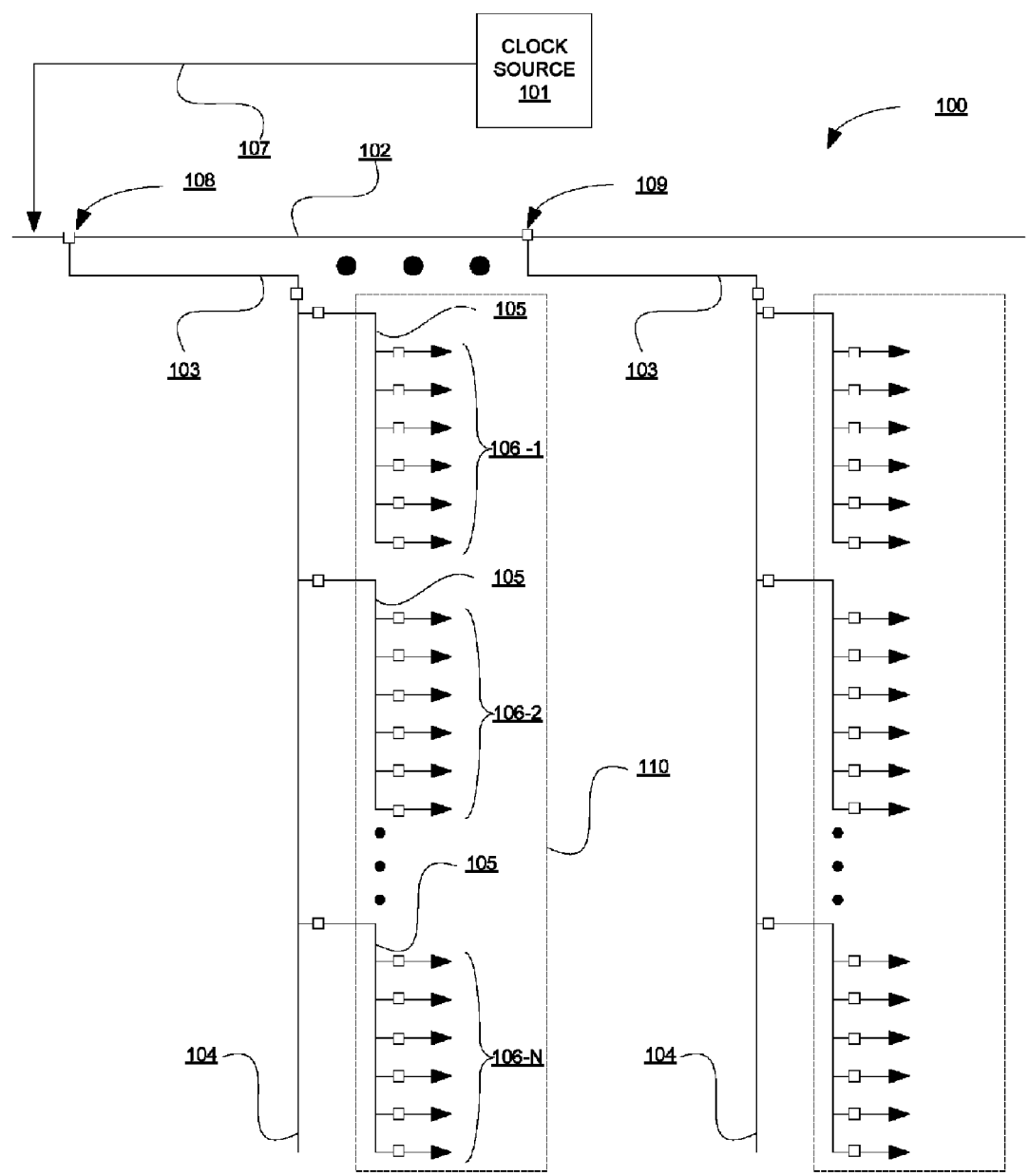
FIG. 1 is a block diagram depicting an exemplary embodiment of a template.

FIG. 1 is a block diagram depicting an exemplary embodiment of a template 100. A clock source 101, configured to provide a clock signal 107, is routed to an HLONG wire 102. HLONG wire 102 is routed to one or more HHLONG wires 103. Notably, propagation delays of clock source output 107 to PIPs 108 and 109 will not be the same, namely, propagation delay to PIP 109 will be longer than that to PIP 108.

VLONG wires 104 are respectively routed from the one or more HHLONG wires 103. Thus, if multiple HHLONG wires 103 are used, multiple VLONG wires 104 are respectively routed to them. One or more VHLONG wires 105 are routed from each VLONG wire 104. Notably, VHLONG wires 105 are symmetrically, or an approximately symmetrically, and respectively routed to VLONG wires 104.

Accordingly, it should be appreciated that within a set 110 of template 100, each set of clock pins 106-N, for N an integer, will have a different propagation delay. These differences are further exacerbated by locations of clock pins 106 relative to connection to a respective VHLONG wire 105, though this propagation delay difference is less significant than delays associated with interconnection of wires 102, 103, 104 and 105.

Thus, it should be appreciated that use of templates to facilitate clock routing for a design is helpful. Templates facilitate providing a clock signal to similarly situated clock pins at approximately the same time for use with clocked devices, such as registers and flip-flops, among others. However, this is not the same as having all clock pins within a set having approximately the same delay, as delays may vary significantly from one set of clock pins to the next set of clock pins. In other words, the farther a clock pin, or more generally a branch of a clock tree, is from a clock source, the greater the RC encountered by the clock signal leading to a longer delay. Notably, PIPs are used to couple an HLONG to an HHLONG, an HHLONG to a VLONG, a VLONG to a VHLONG, and a VHLONG to a clock pin.

Figure 2:
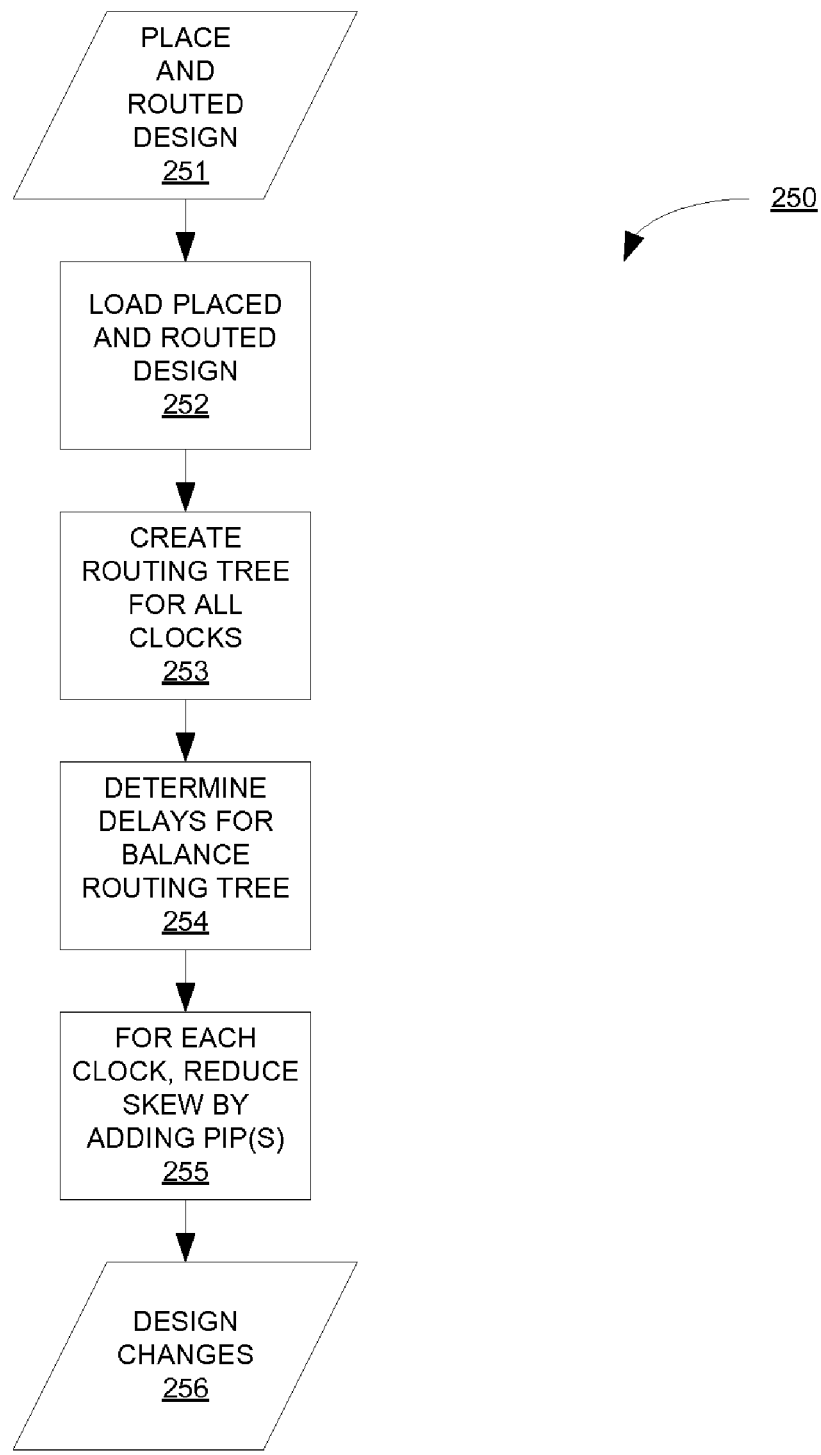
FIG. 2 is a flow diagram depicting an exemplary embodiment of a clock skew reduction flow.

FIG. 2 is a flow diagram depicting an exemplary embodiment of a clock skew reduction flow 250. Once a design has been synthesized, mapped, placed and routed, clock signals are routed. Accordingly, a routing tree for clock signals may be obtained from such routed design. At 252, a placed and routed design 251 is loaded or otherwise obtained. At 253, a routing tree for clock signal routes ("clocks") is generated. For a more complete solution, a routing tree generated at 253 is for all clocks.

Figure 3:
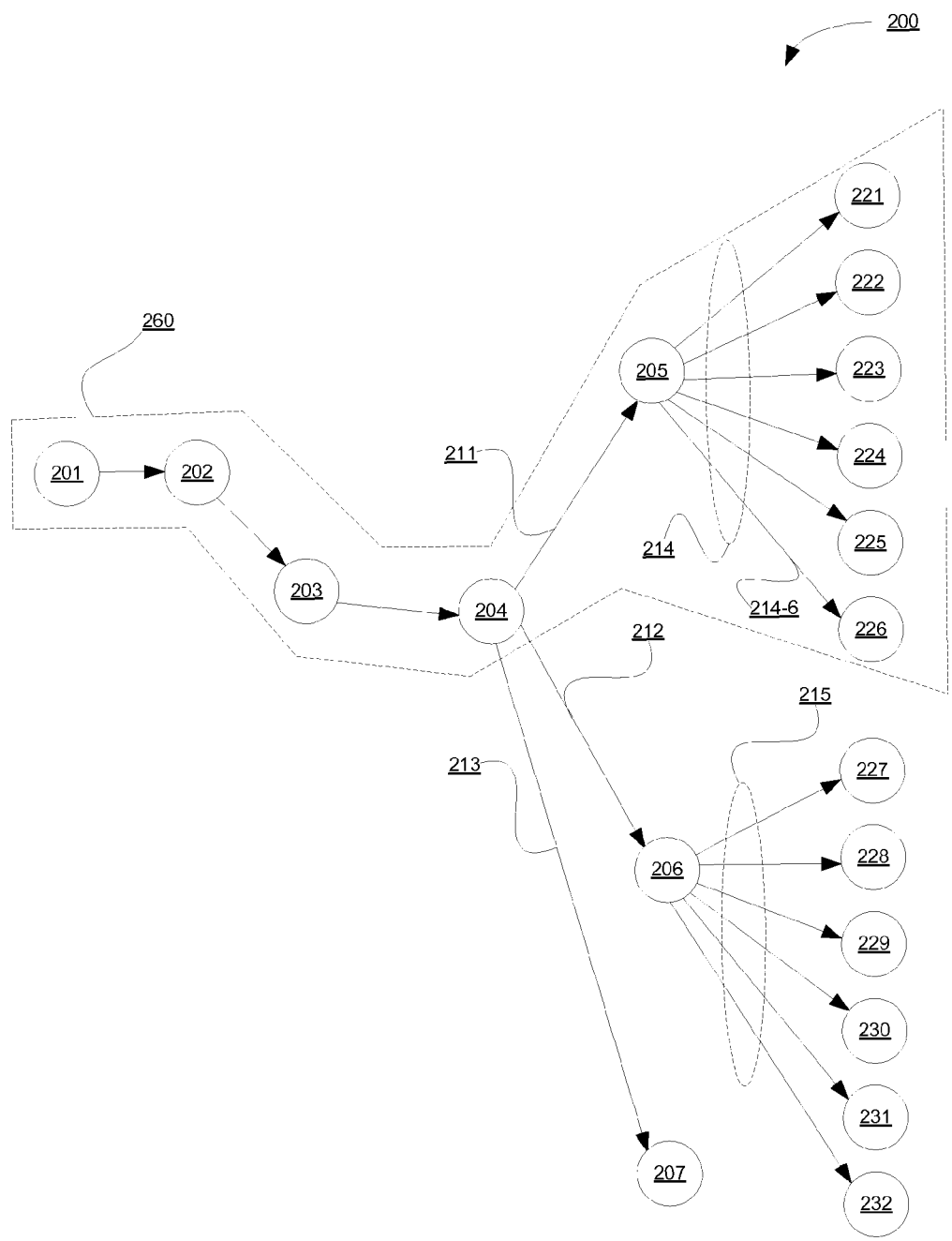
FIG. 3 is a tree diagram depicting an exemplary embodiment of a routing tree 200 for clocks.

FIG. 3 is a tree diagram depicting an exemplary embodiment of a routing tree 200 for clocks. Routing tree 200 may be obtained from a routed design, as previously described. Nodes, such as nodes 201 through 207, represent wires. Lines, such as lines 211 through 215, represent PIPs. End nodes, such as nodes 221 through 232, represent clock pins.

With continuing reference to FIG. 3 and renewed reference to FIG. 2, with a routing tree 200 for clocks, a bottom up traversal is done on such routing tree, namely, from routed clock pin nodes, such as represented by nodes 221 through 232, to nodes one level up ("parent nodes"), such as nodes 205 and 206, and ultimately to a clock source.

Figure 4:
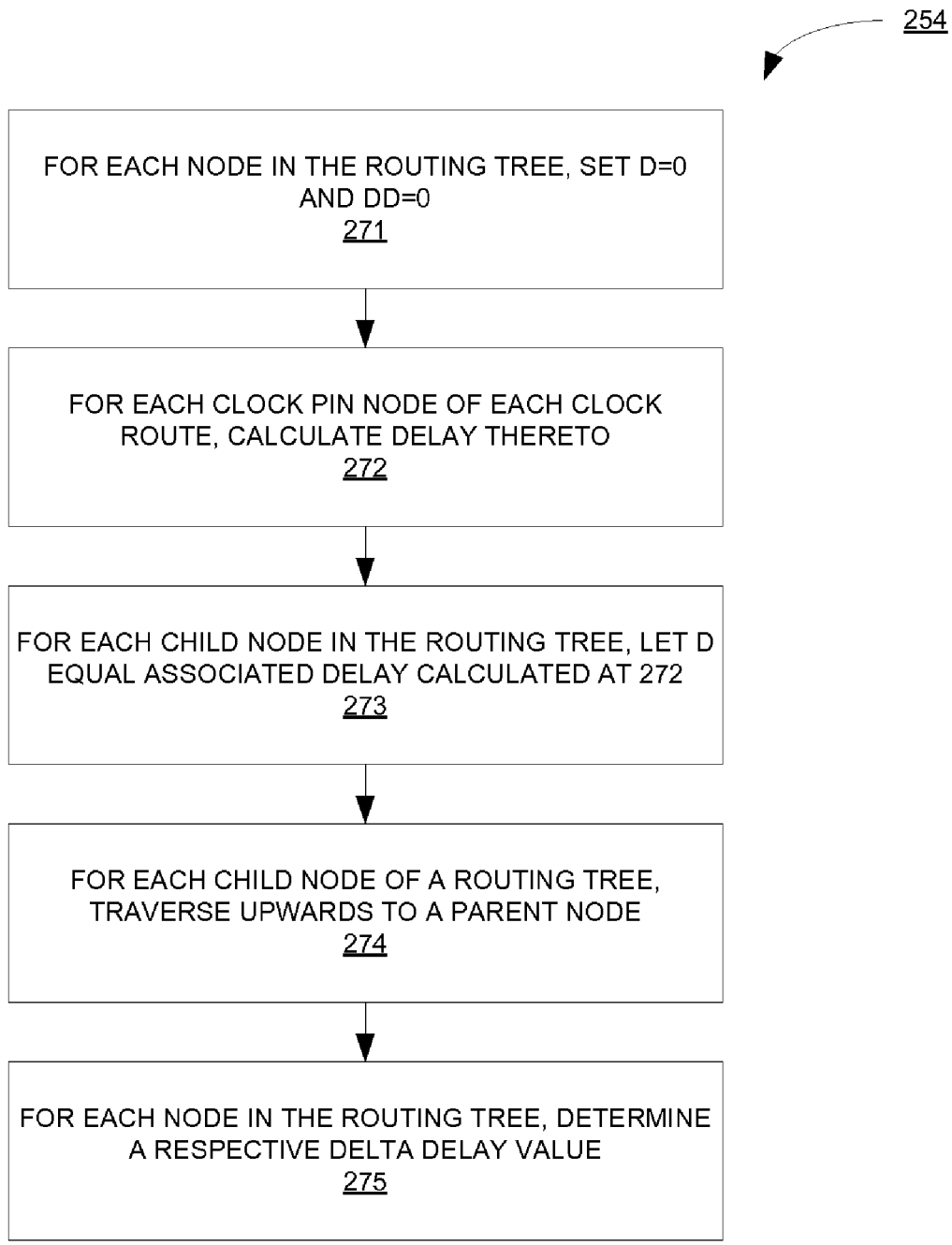
FIG. 4 is a flow diagram depicting an exemplary embodiment of a routing tree balancing value flow.

At 254, values for balancing a routing tree, such as routing tree 200, are determined, and the routing tree is balanced to have at least approximately zero clock skew. In practice, it may not be possible to achieve exactly zero clock skew. Thus, balancing a routing tree to a target value, such as zero clock skew, may be done, though zero clock skew need not necessarily be achieved. Referring to FIG. 4, there is shown a flow diagram depicting an exemplary embodiment of a routing tree balancing flow 254. With continuing reference to FIG. 4 and renewed reference to FIGS. 2 and 3, at 271, for each node in a routing tree, two values are initialized. These two values are called delay ("D") and delta delay ("DD"). Both of these values are initialized to zero for each node in the routing tree. At 272 routing delay is calculated for each clock pin, such as nodes 221 through 232, for a clock route, such as clock route 260. This calculation may be done with a computer-assisted-design ("CAD") tool called a delay calculator. Notably, for purposes of clarity of description by example, sample delay values are used. However, delay values, other than the sample delay values, may be used. Table I lists examples of delays for each of pins 221 through 232.

TABLE I

| NODE REF. NUMBER | DELAY (D) (IN PICOSECONDS) | Delta Delay (DD) (IN PICOSECONDS) |
| --- | --- | --- |
| 221 | 726 | 0 |
| 222 | 722 | 4 |

TABLE I-continued

| NODE REF. NUMBER | DELAY (D) (IN PICOSECONDS) | Delta Delay (DD) (IN PICOSECONDS) |
|---|---|---|
| 223 | 718 | 8 |
| 224 | 714 | 12 |
| 225 | 710 | 16 |
| 226 | 706 | 20 |
| 227 | 710 | 0 |
| 228 | 706 | 4 |
| 229 | 702 | 8 |
| 230 | 698 | 12 |
| 231 | 694 | 16 |
| 232 | 690 | 20 |

At 273, each pin node, such as pin nodes 221 through 232, has its D value set to a calculated delay for the node as determined at 272. This association is indicated in Table I.

At 274, from each pin node, such as pin nodes 221 through 232, the routing tree, such as routing tree 200, is traversed from the clock pins toward a clock source ("upward"). This traversal continues until an end of the route is reached, such as when the clock source for the route is reached, or until a stop condition is reached, as described below in additional detail with reference to FIG. 5.

Figure 5:
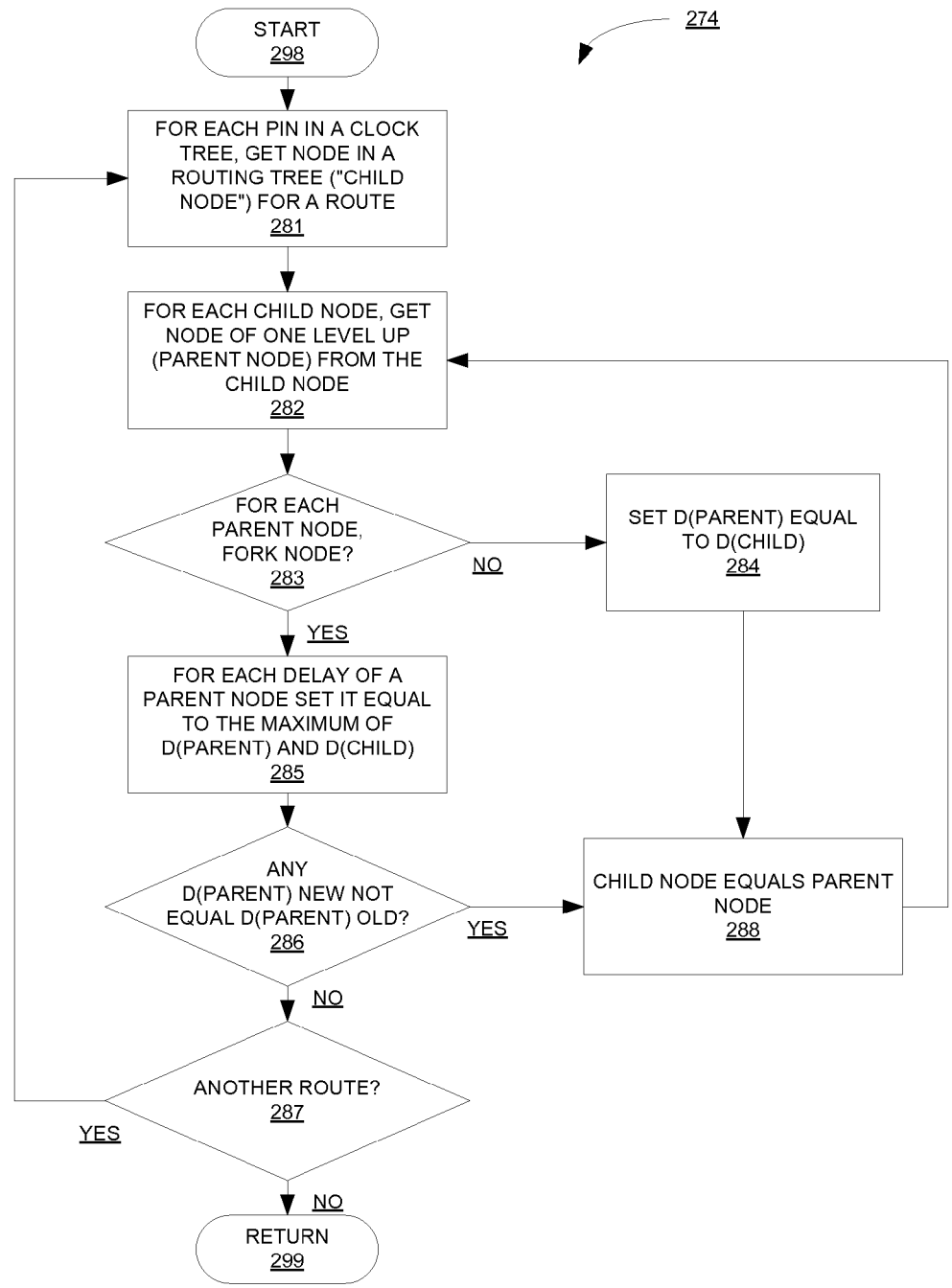
FIG. 5 is a flow diagram depicting a routing tree balancing flow.

Referring to FIG. 5, there is shown a flow diagram depicting a routing tree balancing flow 274. Routing tree balancing flow 274 begins at 298. With continuing reference to FIG. 5, and renewed reference to FIGS. 2 through 4, a lower level node ("child node"), such as pin nodes 221 through 232, is obtained from a routing tree at 281 for each pin of a route in an associated clock tree. At 282, for each child node obtained, an upper level node ("parent node") for the child node is obtained. For example, node 205 is a parent node of node 221 in FIG. 3. At 283, it is determined for each parent node obtained at 282 whether it is a fork node. For example, in routing tree 200, nodes 204, 205 and 206 are all fork nodes, no other nodes in routing tree 200 are fork nodes. Thus, a fork node is a node having more than one output branch, such as output branches 214 of node 205.

At 285, for each parent node that is a fork node, delay of the parent node ("D(PARENT)") is set to equal the maximum of delay of a child node ("D(CHILD)") or the current delay of the parent node D(PARENT). For example, if a current D(PARENT) is less than D(CHILD), then D(PARENT) is set equal to D(CHILD), and vice versa.

At 286, it is determined whether there is any change in each D(PARENT) from its delay setting just prior to 285. In other words, does D(PARENT) previous equal D(PARENT) current. If no D(PARENT) changed between current and previous values (the above-mentioned stop condition), then at 299 routing tree balancing flow 274 returns if there are no other routes to process. If, however, a D(PARENT) did get changed, upward propagation of routing tree 200 continues until no D(PARENT) changes in value as determined at 286 or until a clock source pin node is reached, such as clock source pin node 201. Notably, 286 is specific to upward traversal of a particular route, and thus at 287 it is determined whether there is another route for routing tree balancing flow 274 to process. If there is another route to process, such route is obtained at 281 and processed as previously described. If there is no other route to process, routing tree balancing flow 274 returns at 299.

For each parent node not a fork node at 283, D(PARENT) for each such parent node is set to a delay value D(CHILD) of its child node at 284.

For continued upward progression on a routing tree after 284 or a change in a D(PARENT) at 286, a parent node may be set equal to a child node at 288. In other words, the parent node is now considered the child node for the next iteration. Accordingly, at 282 for a non-initial iteration, each child node, namely, each parent node of an immediately previous iteration, is obtained.

Thus, generally, after an initial iteration, all nodes have their D value indicating a highest delay among all pins electrically downstream from them, as described below in additional detail. All forks of all routes are now traversed. For each child node of a fork, the DD value of the child node is updated to reflect the difference in delay D between the parent node and a child node, as described below in additional detail.

Returning to FIG. 4, after traversing a routing tree at 274, at 275 DD values for each node in the routing tree are determined. DD of a node is D(PARENT) minus D(CHILD). Thus, continuing the above example, clock pins ending at nodes 221 through 226 have delays from 706 ps to 726 ps. To determine values to balance such delays, the delay of 726 ps is selected as for the delay of the fork node or the parent node 205. After which, delay for output branches of fork node 205 less than 726 ps are raised to make them at least approximately 726 ps. For example, delay on branch 214-6 may be raised 20 ps. DD values in Table I indicate approximate ranges for increase in delay. By continuing determining greatest delay and adding delay until all fork nodes of a clock route have been processed, all clock pins should have at least an approximately balanced delay values, namely, a total delay of DD plus D as associated with each clock pin, where DD plus D in each instance is approximately equal to the slowest clock pin prior to propagation delay balancing. Continuing the above example, Table II list D and DD values for fork nodes of routing tree 200.

TABLE II

| NODE REF. NUMBER | DELAY (D) (IN PICOSECONDS) | Delta Delay (DD) (IN PICOSECONDS) |
|---|---|---|
| 204 | 726 | 0 |
| 205 | 726 | 0 |
| 206 | 710 | 16 |

Notably, after determining values for DD, circuitry to add such delay is added to a design.

Returning to FIG. 2, at 255 each clock having a non-zero DD value in its routing tree may have PIP circuitry added to its propagation path in order to increase propagation delay on wires with a positive DD value causing greater delay to reduce clock skew. Output 256 from clock skew reduction flow 250 are design changes to be made in order to increase propagation delay of certain wires which are part of the routing tree of clocks to reduce skew. Once DD values are known for a wire at least approximately balancing a clock tree, one or more PIPs are added to this wire to provide an added delay which is at least approximately equal to DD without exceeding DD. One or more PIPs ("a set of PIPs") may not be available which exactly equals DD, and thus clock skew may not be completely alleviated. However, clock skew can be reduced by adding delay that approximates DD and is not greater than DD.

Figure 6:
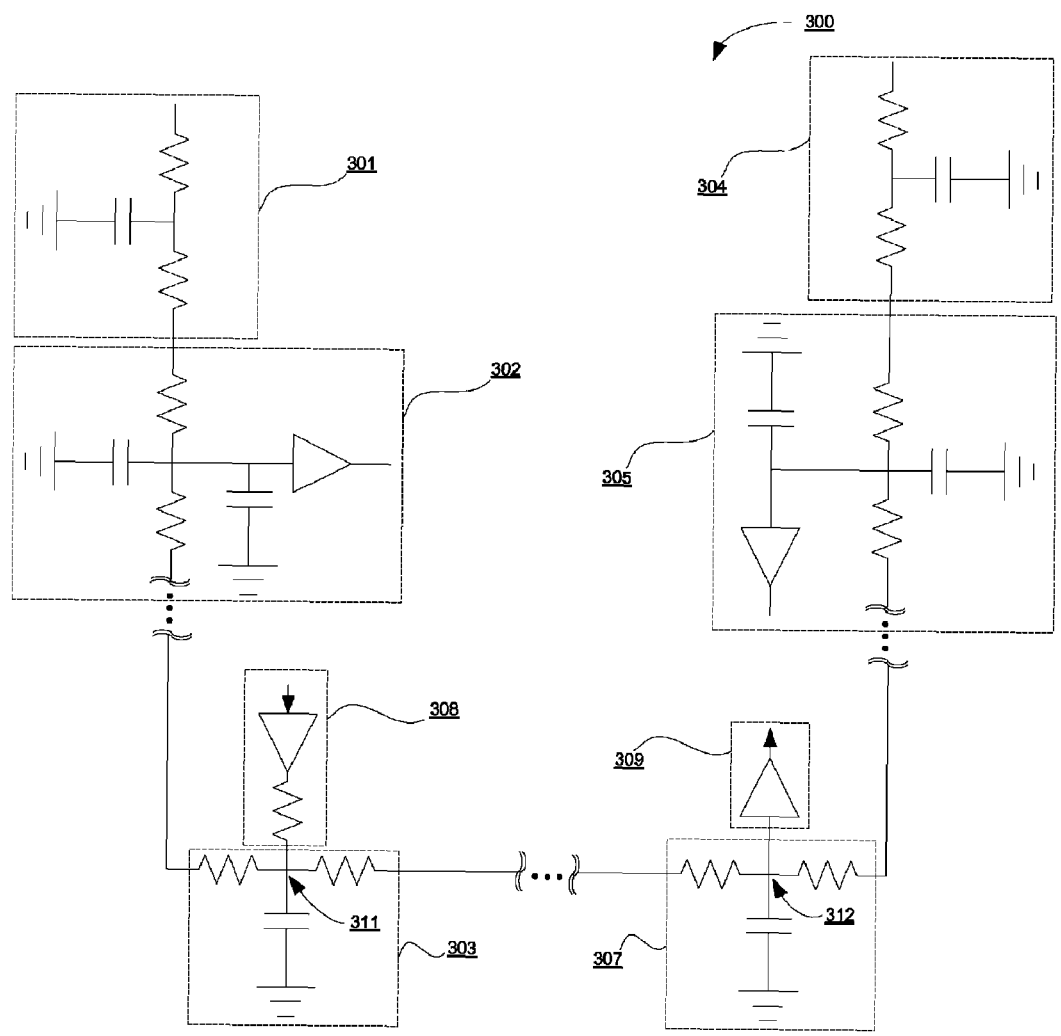
FIG. 6 is a schematic diagram depicting an exemplary embodiment of a clock signal line formed of a plurality of segments for a route.

By having a buffered architecture, delay becomes additive across a buffer. Accordingly, buffered networks may be evaluated in piecewise or modular manner. FIG. 6 is a schematic diagram depicting an exemplary embodiment of a RC tree of a clock signal line 300 formed of a plurality of segments for a particular wire, such as an HLONG, which is part of the routing tree of a clock signal. Segments 301 and 304 are respective RC network models of a segment of the HLONG wire. Segments 302 and 305 are respective buffered RC network models of a PIP. These models may be used to determine how many and which PIPs to add to at least approximate a delay to be added, namely, DD, without exceeding DD. A DD value being the "delta/extra delay" that is added to the HLONG wire, is pre-calculated, for example in routing tree balancing flow 274 of FIG. 5.

A buffered-resistive model of an input 308 connects at some location of a wire, for example an HLONG wire 300. In this example, input 308 is driving at a location 311 of a HLONG wire segment 303. A buffered output model of an output 309 connects at some location of HLONG wire 300. In this example, output 309 is connected at a location 312 of HLONG wire segment 307. Segments 301 and 302 are coupled to the left of input and output nodes 311 and 312. Segments 304 and 305 are coupled to the right of input and output nodes 311 and 312. Notably, one or more PIPs, as well as one or more HLONG wire segments, may be coupled to the right, left or between input node 311 and output node 312, for this RC network. However, location of addition of PIPs will affect the RC encountered by a propagating clock signal, and thus affect the delay that will be increased by the addition of an extra PIP to RC tree network 300.

Once a routing tree is balanced for values of DD to be added to each node as appropriate, delay is added to balance delay of a node with its sibling node experiencing the greatest delay. Unused PIPs are added to incrementally increase delay to the node to balance delay. Again even if a set of PIPs cannot be found that adds delay sufficient to exactly equal DD, a set of one or more PIPs may be used having an added delay close to DD. Accordingly, clock skew is reduced or removed depending on how closely added delay is to DD. Furthermore, because delay is being added, DD should not be exceeded to avoid having a delay-modified node becoming the slowest sibling node.

Figure 7:
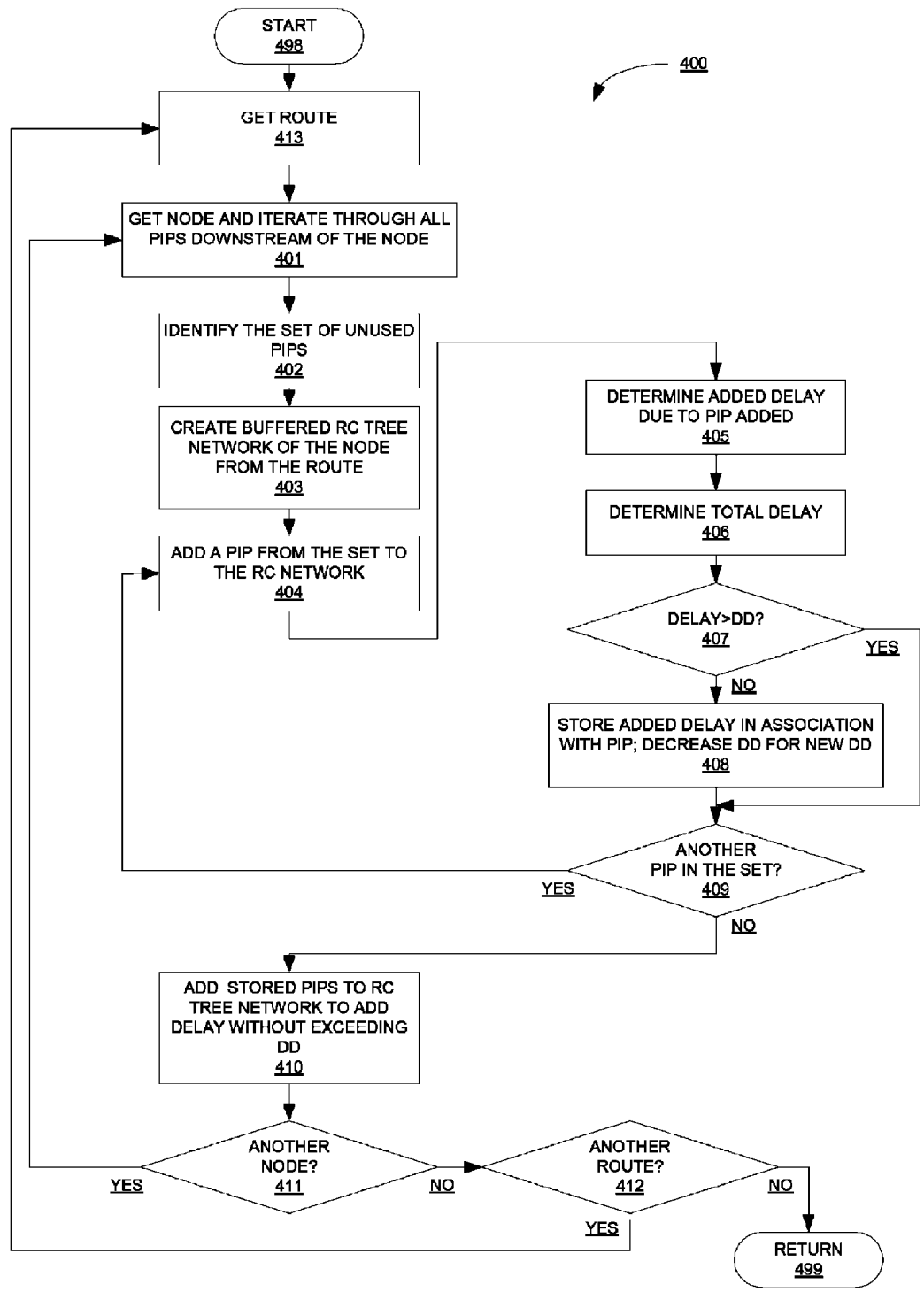
FIG. 7 is a flow diagram depicting an exemplary embodiment of a delay addition flow.

FIG. 7 is a flow diagram depicting an exemplary embodiment of a PIP selection flow 400. PIP selection flow 400 begins at 498. At 413, a route is obtained. At 401, a node on the route is obtained, and PIPs downstream of the node obtained are iterated through to identify a set of unused PIPs at 402. Notably, all or a portion of unused PIPs may be identified. At 403, a buffered RC tree network is created for the node, for example based on the RC model of the wire provided to the CAD tool. FIG. 6 is an example of such a buffered RC tree network. Notably, in a buffered architecture, a PIP doing the driving of a node and PIPs being driven by the node are buffered, and thus an RC tree for a route, is in isolation of an RC tree for the rest of the signal route.

At 404, an unused PIP identified at 402 is added to the RC network created at 403. Addition of a PIP will cause additional capacitance, including in particular additional parasitic capacitance at the input of the buffered PIP. Thus, addition of a PIP will increase the delay. Recall, such an unused PIP is electrically downstream of the node being processed.

At 405, the amount of delay due to addition of the PIP at 404 is determined. Notably, by repeating 405 for each unused downstream PIP, added delay possible due to each available exit point downstream from a node may be determined. The delay due to the addition of a PIP may be determined using an RC model network, such as the one previously described with respect to FIG. 6, in a computer aided design tool using Penfield Rubinstein, Elmore or other known delay model.

At 406, delay as determined at 405 is added to all added delay from a prior iteration, if any.

At 407, a determination is made as to whether delay total delay as determined at 406 is greater than DD for the node obtained at 401. If the total delay is greater than DD, a check for another PIP is made at 409. If, however, total delay is not greater than DD, then the amount of added delay determined is stored in association with its PIP at 408. At 408, DD is decremented by the amount of delay added by addition of the PIP for a new DD value for a subsequent iteration if another PIP is to be evaluated. At 409, a check for another PIP from the set of unused downstream PIPs is made. If there is another PIP in the set, then it is added to the RC network at 404.

Alternatively, step 406 may be omitted, in which embodiment at 407 a check may be made to determine if added delay is greater than DD. In this alternative embodiment, DD is not decremented at 408. Thus, a set of all unused PIPs having an added delay less than or equal to DD may be stored at 408.

If at 409 another PIP is not in the set, then at 410 PIPs are added to the RC network. PIPs are added such that the total of all added PIPs does not exceed DD. This is guaranteed in the embodiment where total delay is checked at 407. However, in the embodiment where added delay is checked at 407, PIP added delays stored at 408 may be evaluated in an independent manner, namely, evaluating PIP added delays irrespective of each other for finding a set of such PIP added delays whose sum is closest or equal to DD. This alternative embodiment may provide closer solutions to DD, as success of selecting PIP added delays is order dependent.

At 411, a check is made for another node. If another node is to be processed, it is obtained at 401. If there is no other node to process, a check is made at 412 for another route. If another route is to be processed, it is obtained at 413. If there is no other route to process, delay addition flow 400 returns at 499.

Thus, skew reduction may be done post placement and routing of a design altering such placement and routing. This is because unused PIPs electrically downstream of a node are switch on to add parallel or parasitic capacitance to reduce skew. This skew reduction may be applied to critical clock signals as well, as added delay does not exceed DD. It should be understood that use of a fully buffered architecture has been described. However, a partially buffered architecture may be used, though an RC tree for a partially buffered architecture will be more complicated due to there being no, or at least not as much, RC tree isolation as in a fully buffered architecture.

Figure 8:
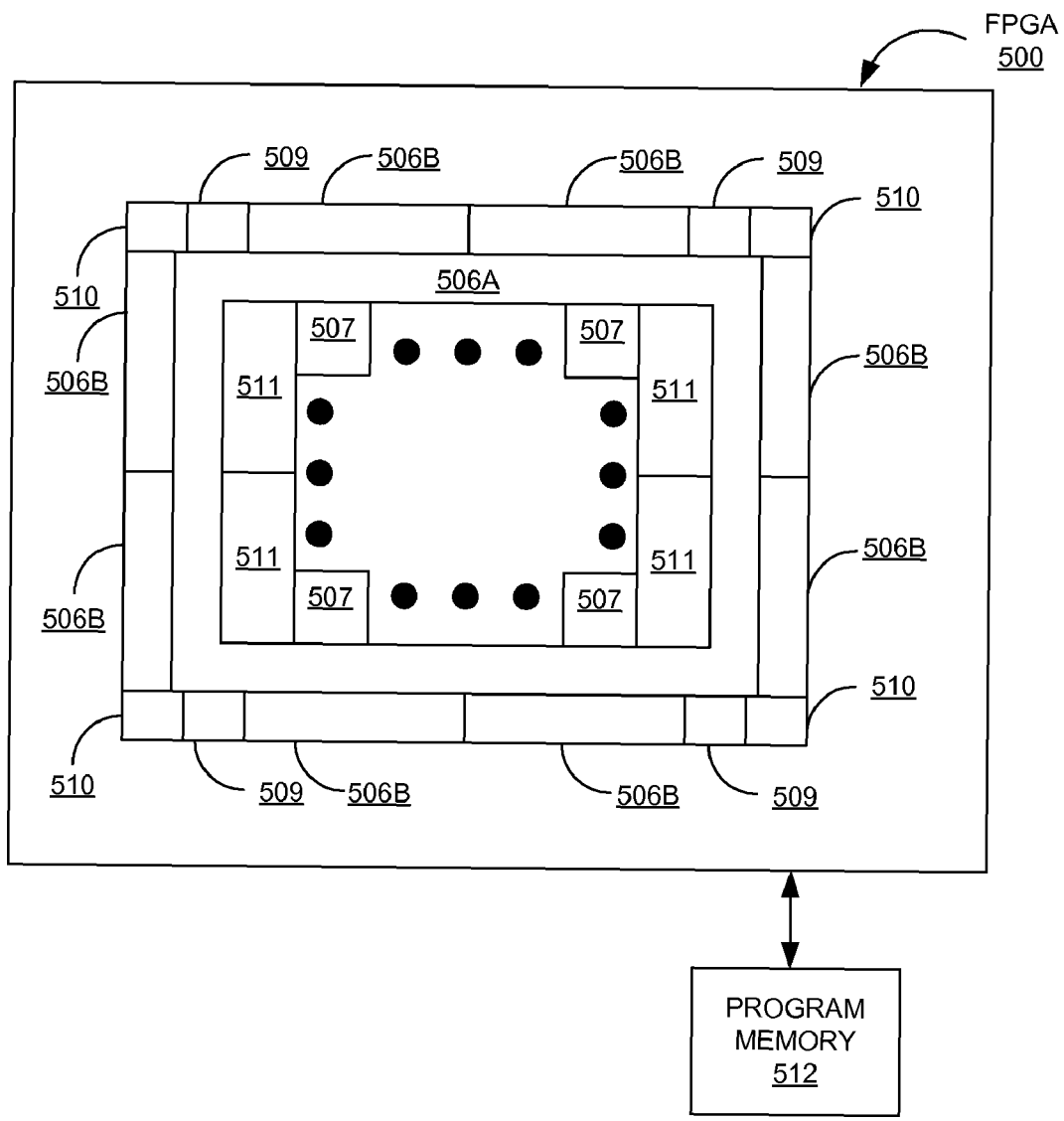
FIG. 8 is a high-level block diagram depicting an exemplary embodiment of a well-known FPGA.

FIG. 8 is a high-level block diagram depicting an exemplary embodiment of a well-known FPGA 500. An FPGA 500 is an example of an integrated circuit that may be used for implementing one or more aspects of the invention. However, other programmable logic device ("PLD") integrated circuits other than FPGAs, including complex PLDs ("CPLD") and other integrated circuits with configurable logic, may be used.

FPGA 500 includes configurable logic blocks (CLBs) 507, I/O routing ring 506A, memory, such as random access memory 511, delay lock loops (DLLs) 509, multiply/divide/de-skew clock circuits 510, and programmable input/output blocks (IOBs) 506B. IOBs 506B may include transceivers, such as multi-gigabit transceivers ("MGTs"). DLLs 509 and clock circuits 510 collectively provide digital clock modules or managers (DCMs). External memory 512 may be coupled to FPGA 500 to store and provide a configuration bitstream to configure FPGA 500, namely, to program one or more memory cells to configure CLBs 507 and IOBs 506B. Notably, a placed and routed design may be instantiated in FPGA 500 using PIPs for clock skew reduction, as described above.

Figure 9:
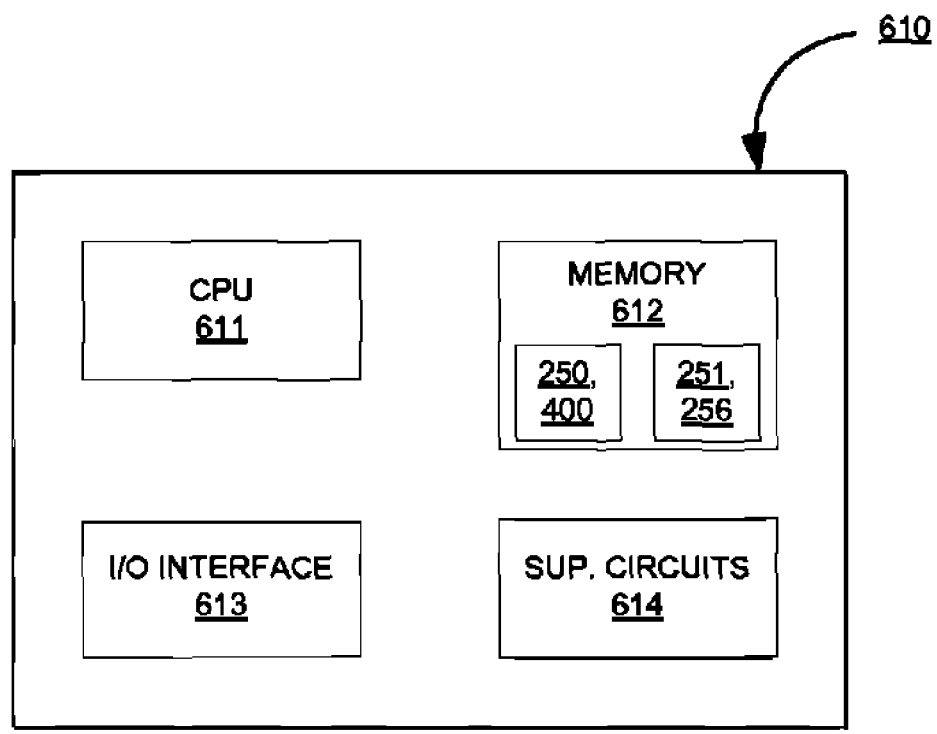
FIG. 9 is a high-level block diagram of an exemplary embodiment of a programmed computer.

FIG. 9 is a high-level block diagram of an exemplary embodiment of a programmed computer 610. Programmed computer 610 includes a central processing unit (CPU) 611, memory 612, a variety of support circuits 614, and an input/output (I/O) interface 613. CPU 611 may be any type of microprocessor known in the art. Support circuits 614 for CPU 611 include conventional cache, power supplies, clock circuits, data registers, I/O interfaces, and the like. Memory 612 may be directly coupled to CPU 610 or coupled through I/O interface 613, and I/O interface may be coupled to a conventional keyboard, network, mouse, display printer, and interface circuitry adapted to receive and transmit data, such as data files and the like.

Memory 612 may store all or portions of one or more programs or data to implement processes in accordance with one or more aspects of the invention, such as for flows 250 and 400, as well as input and output data 251 and 256, respectively. Additionally, those skilled in the art will appreciate that one or more aspects of the invention may be implemented in hardware, software, or a combination of hardware and software. Such implementations may include a number of processors independently executing various programs and dedicated hardware, such as application specific integrated circuits (ASICs).

Programmed computer 610 may be programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in memory 612. Memory 612 may include one or more of the following random access memory, read only memory, magneto-resistive read/write memory, optical read/write memory, cache memory, magnetic read/write memory, and the like, as well as signal-bearing media as described below.

One or more aspects of the invention are implemented as program products for use with computer 610. Program(s) of the program product defines functions of embodiments in accordance with one or more aspects of the invention and can be contained on a variety of signal-bearing media, such as computer-readable media having code, which include, but are not limited to: (i) information permanently stored on non-writable storage media (e.g., read-only memory devices within a computer such as CD-ROM or DVD-RAM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of one or more aspects of the invention represent embodiments of the invention While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. For example, a target clock skew of zero was used, such that a greatest delay to a clock pin has no added delay. In other words, delay is added to only a portion of clock signal propagation paths to clock pins. However, a target clock skew may be greater than zero, such that delay is added to all clock signal propagation paths to clock pins. Claim(s) listing steps do not imply any order of the steps.

What is claimed is:

1. A method for reducing clock skew, comprising:
   obtaining a placed and routed design;
   generating a routing tree for a clock signal of the placed and routed design, the routing tree having at least one route and a plurality of clock pin nodes, the clock signal being divided into a plurality of clock signals responsive to the clock pin nodes;
   determining delays of the plurality of clock signals to the plurality of clock pin nodes;
   balancing the routing tree to a target clock skew; and
   selectively adding, by a computer, programmable interconnect circuits to the routing tree to reduce clock skews of the plurality of clock signals, the clock skews being reduced at the plurality of clock pin nodes for at least a portion of the plurality of clock pin nodes.

2. The method, according to claim 1, further comprising outputting design changes associated with addition of the programmable interconnect circuits.

3. The method, according to claim 1, wherein the determining the delays comprises:
   initializing delay parameters for wires which are part of the routing tree;
   determining delay to clock pin values for the at least one route; and
   determining delay differences for the wires of the routing tree.

4. The method, according to claim 3, wherein the determining the delays comprises:
   traversing the routing tree from the plurality of clock pin nodes toward a clock source node; and
   determining differences in delays for higher-level nodes than a current node; and
   checking for another route.

5. A non-transitory computer-readable medium having computer readable instructions, which when executed by a processor in response to receiving a placed and routed design, causes execution of a method comprising:
   generating a routing tree for a clock signal of the placed and routed design, the routing tree having at least one route and clock pin nodes, the clock signal being divided into clock signals responsive to the clock pin nodes;
   determining delays of the clock signals to the clock pin nodes;
   balancing the routing tree to a target clock skew; and
   selectively adding programmable interconnect circuits to the routing tree to reduce clock skews of the clock signals, the clock skews being reduced at the clock pin nodes for at least a portion of the clock pin nodes.

6. The computer-readable medium having computer readable instructions, according to claim 5, which further causes the execution of the method comprising outputting design changes associated with addition of the programmable interconnect circuits.

7. The computer-readable medium having computer readable instructions, according to claim 5, wherein the determining the delays comprises:
   initializing delay parameters for wires which are part of the routing tree;
   determining delay to clock pin values for the at least one route; and
   determining delay differences for the wires of the routing tree.

8. The computer-readable medium having computer readable instructions, according to claim 7, wherein the determining the delays comprises:

traversing the routing tree from the plurality of clock pin nodes toward a clock source node; and determining differences in delays for higher-level nodes than a current node; and checking for another route.

9. A method for reducing clock skew, comprising:

obtaining a placed and routed design;

generating a routing tree for a clock signal of the placed and routed design, the routing tree having at least one route and a plurality of clock pin nodes, the clock signal being divided into a plurality of clock signals;

determining delays of the plurality of clock signals to the plurality of clock pin nodes;

identifying differences in delay values when routing the plurality of clock signals between a predetermined node and the plurality of clock pin nodes; and selectively adding, by a computer, programmable interconnect circuits to the routing tree to reduce clock skews of the plurality of clock signals based upon the differences in delay values, the clock skews being reduced at the plurality of clock pin nodes for at least a portion of the plurality of clock pin nodes.

10. The method, according to claim 9, further comprising outputting design changes associated with addition of the programmable interconnect circuits.

11. The method, according to claim 9, wherein the determining the delays comprises traversing the routing tree from the plurality of clock pin nodes toward a clock source node.

12. The method, according to claim 9, further comprising identifying a clock pin node associated with a longest delay value of the delay values.

13. The method, according to claim 12, further comprising maintaining a path having the longest delay value.

14. The method, according to claim 13, further comprising adjusting each path to each other clock pin node of the plurality of clock pin nodes to have a delay value which are approximately equal to the longest delay value.

15. The method, according to claim 14, wherein adjusting each path to each other clock pin node of the plurality of clock pin nodes comprises adjusting each path to each other clock pin node to have a delay value which is approximately equal to the longest delay value without exceeding the longest delay value.

16. The method, according to claim 9, further comprising determining a delay for each node of the routing tree.

17. The method, according to claim 9, further comprising determining a longest delay path for each route of the routing tree.

18. The method, according to claim 9, wherein selectively adding, by a computer, programmable interconnect circuits to the routing tree comprises selectively adding programmable interconnect points.

19. The method, according to claim 18, further comprising identifying a plurality of unused programmable interconnect points.

20. The method, according to claim 19, wherein selectively adding programmable interconnect points comprises adding programmable interconnect points of the plurality of unused programmable interconnect points.

\* \* \* \* \*